(12) United States Patent
Wan

(10) Patent No.: US 10,312,865 B2
(45) Date of Patent: Jun. 4, 2019

(54) VOLTAGE RANGE EXTENSION FOR DIFFERENCE AMPLIFIER

(71) Applicant: Analog Devices, Inc., Norwood, MA (US)

(72) Inventor: Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 8 days.

(21) Appl. No.: 15/784,842

(22) Filed: Oct. 16, 2017

(65) Prior Publication Data

US 2019/0115874 A1   Apr. 18, 2019

(51) Int. Cl.
*H03F 3/45* (2006.01)
*H03F 1/02* (2006.01)
(Continued)

(52) U.S. Cl.
CPC .......... *H03F 1/0233* (2013.01); *H03F 1/26* (2013.01); *H03F 1/52* (2013.01); *H03F 3/45179* (2013.01); *H03F 2200/165* (2013.01); *H03F 2200/462* (2013.01); *H03F 2200/481* (2013.01); *H03F 2200/78* (2013.01); *H03F 2203/45136* (2013.01); *H03F 2203/45151* (2013.01); *H03F 2203/45288* (2013.01)

(58) Field of Classification Search
CPC ...... H03F 1/0233; H03F 3/45179; H03F 1/26; H03F 1/52; H03F 2200/78; H03F 2203/45151; H03F 2200/481; H03F 2200/165; H03F 2203/45136; H03F 2203/45288; H03F 2200/462
See application file for complete search history.

(56) References Cited

U.S. PATENT DOCUMENTS 7,479,832 B2 * 1/2009 Imayama ............... H03F 1/0266
330/136
7,821,333 B2 10/2010 Yan et al.
(Continued)

OTHER PUBLICATIONS

"Bidirectional, Zero Drift, Current Sense Amplifier", Analog Devices Data Sheet AD8418, (Sep. 11, 2013), 17 pgs.
(Continued)

*Primary Examiner* — Khanh V Nguyen
(74) *Attorney, Agent, or Firm* — Schwegman Lundberg & Woessner, P.A.

(57) ABSTRACT

A difference amplifier circuit can be used to amplify a differential input signal representative of a current flowing through a current sensing element, such as a resistor. In certain applications, a common mode voltage established at an input of the difference amplifier circuit can be greater in magnitude than a supply voltage provided to the difference amplifier circuit. A component of the differential input signal, such as one polarity of the differential signal, can be used to power the difference amplifier circuit. Such powering of the difference amplifier by the component of the differential input signal can be performed selectively, such as when a magnitude of the common mode voltage exceeds the supply voltage or another specified threshold. In this manner, a common mode input voltage capability can be greater in magnitude than a magnitude of a supply input voltage provided to an integrated circuit including the difference amplifier circuit.

20 Claims, 7 Drawing Sheets

(51) Int. Cl.
      *H03F 1/52*           (2006.01)
      *H03F 1/26*           (2006.01)

(56) References Cited

U.S. PATENT DOCUMENTS

| | | | |
|---|---|---|---|
| 8,902,005 B2 * | 12/2014 | Wan | H03F 3/45 330/136 |
| 9,595,922 B2 * | 3/2017 | Maderbacher | H03F 3/387 |
| 9,716,398 B2 * | 7/2017 | Lee | H02J 7/025 |
| 2007/0013439 A1 * | 1/2007 | Gutzki | H03F 1/52 330/9 |

OTHER PUBLICATIONS

"High Voltage, High Bandwidth, Current Sense Amplifier AD8410", Analog Devices, (Nov. 2016), 5 pgs.

"INA240 High- and Low-Side, Bidirectional, Zero-Drift, Current-Sense Amplifier with Enhanced PWM Rejection", Texas Instruments, (Jul. 2016), 36 pgs.

"AD8410 High Voltage, High Bandwidth, Current Sense Amplifier Preliminary Data Sheet", www.analog.com, (Sep. 14, 2016), 4 pages.

"AD8418A Bidirectional, Zero Drift, Current Sense Amplifier", www.analog.com, (May 22, 2018), 17 pages.

* cited by examiner

VOLTAGE RANGE EXTENSION FOR DIFFERENCE AMPLIFIER

FIELD OF THE DISCLOSURE

This document pertains generally, but not by way of limitation, to an amplifier circuits and related techniques, and more particularly, to circuits and techniques for amplifying a differential signal, such as representative of a sensed current.

BACKGROUND

In various applications, an electrical current can be sensed such as for purposes of monitoring, protection, or control of a load device. Such current sensing can be performed in relation to single-phase or multi-phase loads. Generally, a sensing resistor can be placed in-line with such a power supply and a load. In a multi-phase system, current sensing elements can be placed in-line with the power supply and loads corresponding to each phase. A current flowing through the power supply and a corresponding load can be determined such as by amplifying and measuring a differential signal representative of a voltage drop produced by the sensing device. An output of such amplification can be used for purposes of monitoring, protection, or control of a load device.

SUMMARY OF THE DISCLOSURE

A difference amplifier circuit can be used to amplify a differential input signal representative of a current flowing through a current sensing element, such as a resistor. Such a difference amplifier circuit can be used for other applications, in addition to or instead of amplification of a signal corresponding to a sensed current. In certain applications, a common mode voltage established at an input of the differential amplifier circuit can be greater in magnitude than a supply voltage provided to a difference amplifier circuit. In certain circumstances, a component of the differential input signal, such as one polarity of the differential signal, can be used to power the difference amplifier circuit. Such powering of the difference amplifier circuit by the component of the differential input signal can be performed selectively, such as when a magnitude of the common mode voltage exceeds the supply voltage or another specified threshold. In this manner, a common mode input voltage capability can be greater in magnitude than a magnitude of a supply input voltage provided to the integrated circuit including the difference amplifier circuit.

In an example, an electrical apparatus for generating a signal indicative of a monitored voltage difference can include an integrated circuit comprising a difference amplifier circuit. The difference amplifier circuit can include a two-terminal input to receive a differential signal, the input having a common-mode input voltage capability exceeding a supply input voltage of the integrated circuit and an output to provide the signal indicative of the input differential signal. The integrated circuit can include an amplifier control circuit, electrically coupled to the difference amplifier circuit, to compare a signal representative of a common-mode input voltage at the input of the difference amplifier circuit to a specified threshold, and, in response, when the signal representative of the common-mode input voltage exceeds the specified threshold, to electrically couple a first terminal of the two-terminal input to the difference amplifier circuit to power the difference amplifier circuit. The amplifier control circuit can include a current source capable of being electrically coupled to a second, opposite-polarity terminal of the two-terminal input to compensate for an offset between respective input currents through the first and second terminals.

In an example, a method for generating a signal indicative of a monitored current through a current sensing element can include amplifying a differential signal indicative of the monitored current using a difference amplifier circuit, and, when an input common mode voltage of the difference amplifier circuit exceeds a specified threshold voltage, changing powering of the amplifier from using a power supply rail to using a component of the differential signal to power the difference amplifier circuit, including compensating for an offset between respective input currents through respective first and second input terminals of the difference amplifier circuit when the difference amplifier circuit is powered using the component of the differential signal.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
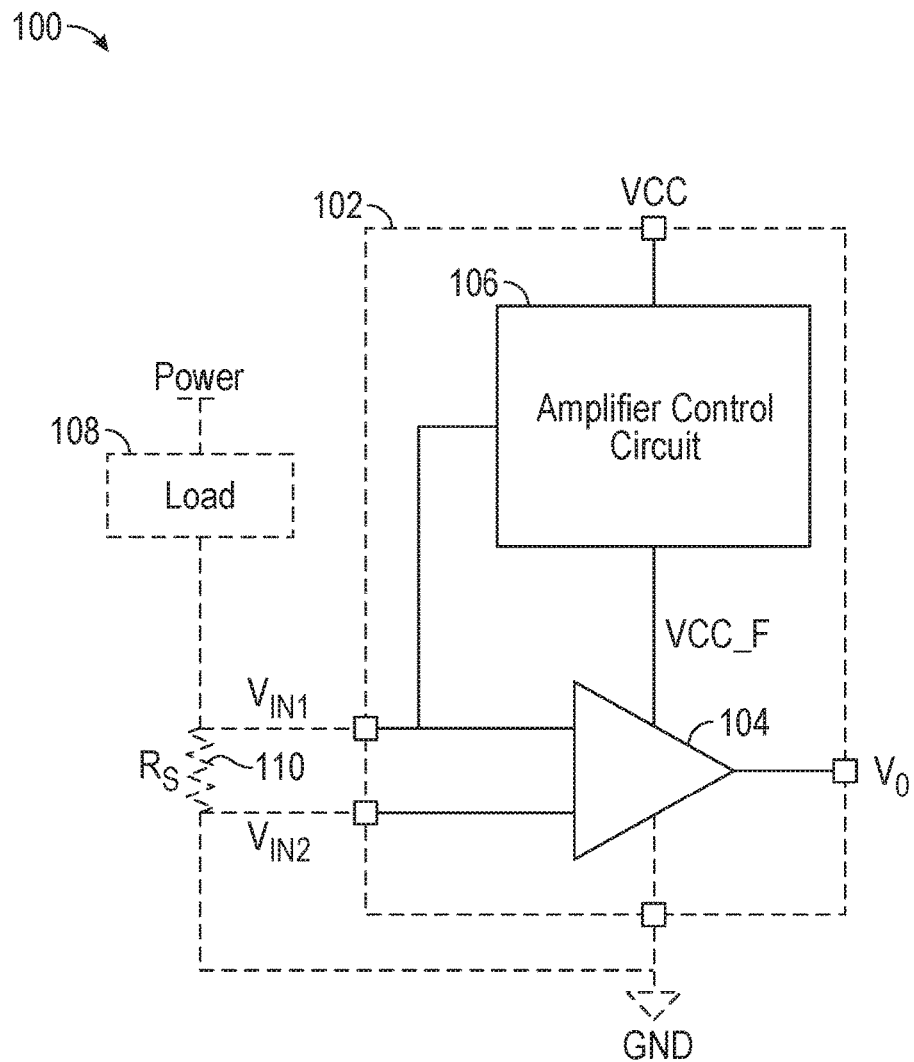
FIG. 1 illustrates generally an example of an electrical apparatus for generating a signal indicative of a monitored current.

A difference amplifier circuit can be used to amplify a signal provided by a current sensing element. The current sensing element can include a resistor located in series with a load device. According to various examples, the load device (or a respective phase of a circuit including a load device) can be operated using a voltage considerably greater in magnitude than the power supply used to power an integrated circuit including the difference amplifier circuit used for current sensing. The present inventor has recognized, among other things, that exposure of the inputs of the difference amplifier circuit to a common-mode voltages in excess of such an integrated circuit supply voltage may preclude use of the integrated circuit for current monitoring, either by saturating the inputs of the amplifier circuit or even damaging the difference amplifier circuit.

In one approach, a resistor network can be used such as to provide an average value of voltages of the differential signal pair being monitored from the current sensing element. The averaged signal can be used to power a portion of the difference amplifier circuit signal chain, such as to establish an internal supply node having a magnitude greater than the supply input node to the difference amplifier integrated circuit. However, such an approach can present challenges. For example, if a simple resistor network is used, without more, then an input offset current at the inputs of the difference amplifier may become dependent on the common-mode voltage. The common-mode voltage dependence can create an offset error discontinuity as the difference amplifier supply node is elevated in voltage beyond the input supply rail provided to the difference amplifier integrated circuit. Furthermore, an input offset current at the inputs of the difference amplifier may become dependent on the input differential signal. Such input differential signal dependence can create gain error.

The present inventor has, among other things, developed an amplifier circuit and control scheme to address such challenges. For example, according to various examples described herein, when a input common-mode voltage is greater in magnitude than a supply input node value, an input stage of a current sensing amplifier can be operated in a self-biasing manner. In this way, an input common-mode voltage range of the amplifier need not be limited by the input supply node value, and a high-voltage power supply input is needed. A majority of the amplifier circuitry can be fabricated using lower-voltage devices, that operate using the input supply node or voltages derived therefrom. In this manner, such lower-voltage devices can achieve one or more of lower offset values, higher-speed (e.g., higher bandwidth) operation, lower fabrication cost, or smaller circuit area, as compared to higher-voltage devices. The present inventor has also recognized, among other things, that use of the apparatus and techniques described herein can allow compatibility with an external resistor-capacitor (RC) filter, such as without degrading gain accuracy and common mode rejection.

FIG. 1 illustrates generally an example of an electrical apparatus 100 for generating a signal (e.g., "Vo") indicative of a monitored current. The apparatus can include an integrated circuit 102 such as including a difference amplifier circuit 104 and an amplifier control circuit 106. The amplifier control circuit 106 can receive an input supply voltage VCC, and can selectively couple VCC or another signal to an internal supply node VCC_F, such as to provide a floating supply for at least a portion of the difference amplifier circuit 104. The difference amplifier circuit 104 can include multiple amplifier stages, such as shown and described in relation to other examples herein (e.g., shown in FIG. 3, and FIG. 4). A current sensing element 110, such as a resistor $R_S$, can be used to provide a differential input voltage representative of a current delivered to a load device 108, such as can be coupled to input terminals $V_{IN1}$, $V_{IN2}$.

The load device 108 may be powered using a mains input, POWER, or another signal derived therefrom, and the voltage at the POWER node is generally established independently and has a different value than the integrated circuit 102 supply input value at the node VCC. The integrated circuit 102 and the load device 108 may be coupled to a commonly-shared reference node, GND. In the illustrative example of FIG. 1, the resistor, $R_S$, is shown as located in series with the reference conductor, but the resistor $R_S$ could be located elsewhere as a portion of the load device 108 circuit. Accordingly, a common-mode voltage present at a differential input pair including $V_{IN1}$ and $V_{IN2}$ may exceed a value of the supply input voltage at the node VCC.

In an example, the amplifier control circuit 106 can compare a signal representative of a common-mode input voltage at the input of the difference amplifier circuit to a specified threshold, and, in response, when the signal representative of the common-mode input voltage exceeds the specified threshold, electrically couple a first terminal $V_{IN1}$ (as shown in FIG. 1), or $V_{IN2}$, of the two-terminal input, to the difference amplifier circuit to power the difference amplifier circuit.

Figure 2:
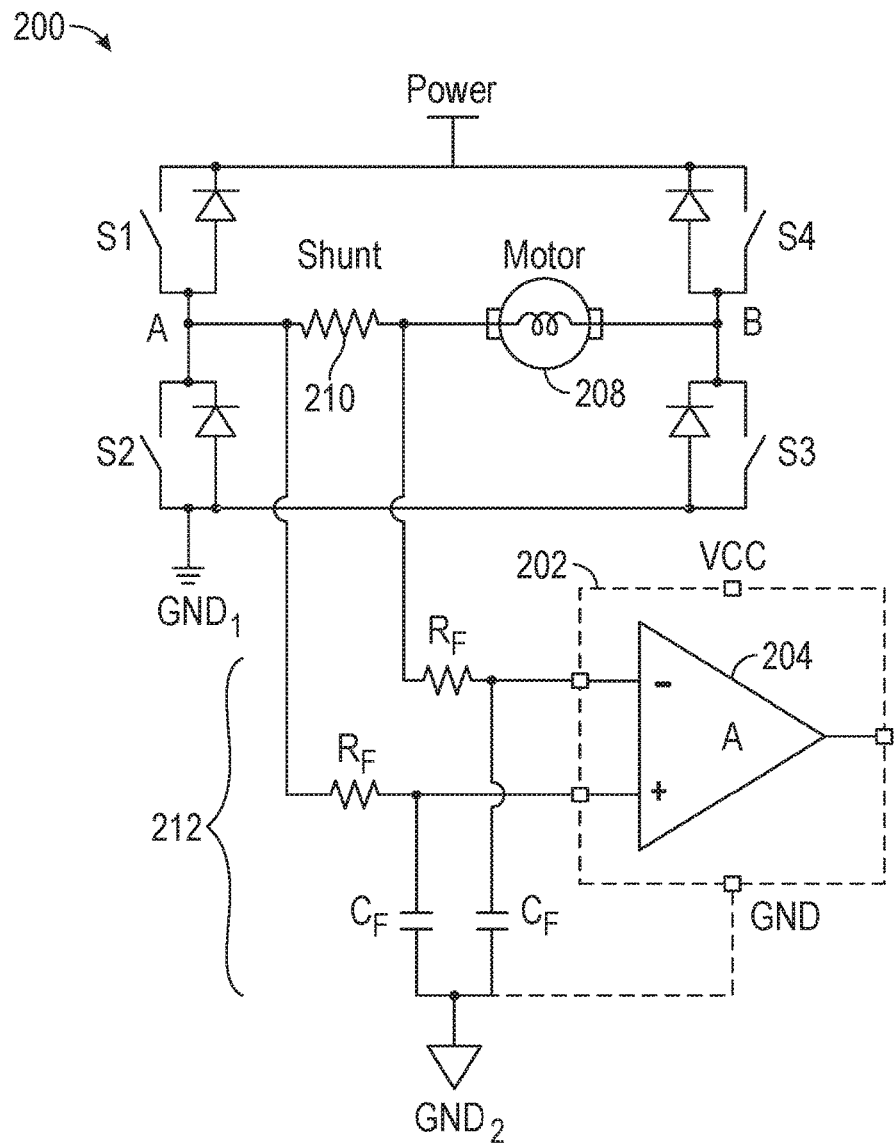
FIG. 2 illustrates generally an example of a system that can include a load device, and an electrical apparatus for generating a signal indicative of a monitored current.

FIG. 2 illustrates generally an example of a system that can include a load device 208 (e.g., a motor), and an electrical apparatus for generating a signal indicative of a monitored current. The electrical apparatus can include an integrated circuit 202, such as including a difference amplifier circuit 204 to provide an output (e.g., Vo) representative of a sensed current, such as by monitoring a differential signal developed across a current sensing element 210 (e.g., a shunt resistor). FIG. 2 illustrates an application of the current sensing amplifier of FIG. 1, such as in relation to an H-bridge motor 208 driver circuit.

The motor driver circuit can include switches S1, S2, S3, and S4, such as controlled by a pulse width modulator, to modulate one or more of a speed or torque of the motor 208. The current through a winding in the motor 208 (only a single phase is shown in the illustration of FIG. 2) flows through the shunt resistor as the current sensing element 210, and develops a voltage difference across the shunt resistor. The differential signal is then amplified by a gain factor (e.g., "A") by the amplifier circuit 204 and any common-mode voltage present at the inputs is generally rejected by the amplifier circuit 204. The configuration shown in FIG. 2 can present challenges, such as when the integrated circuit 202 is powered by a low-voltage supply node VCC (e.g., having a VCC value of 1.2V, 1.5V, 1.8V, 2.2V, 2.5V, 3.0V, 3.3V, or 5V as illustrative examples).

As an example, assume from a time T=T0 to T1, S2 and S4 are closed, and S1 and S3 are open. In this state, a voltage at node B may be close to a high-voltage power bus voltage, (e.g., POWER) such as having a value of 48V in this illustration. A voltage at node A is about zero. At another time, T=T1, S2 and S4 can be opened. The current in the inductance of the motor 208 cannot change instantaneously, and therefore node A can be instantaneously forced to about one diode voltage drop above the power bus voltage value.

A voltage at node B can contemporaneously be pulled below the reference voltage GND$_1$ (e.g., below "ground").

A rate of voltage change at node A and B can be on the order of about 5V to 10V per nanosecond (V/nS), in this illustrative example. Accordingly, a common-mode voltage across the current sensing element 210 may change rapidly. An RC low pass filter circuit 212 (including pairs of filter elements RF and CF) can be placed between the shunt resistor RS and the current sensing difference amplifier circuit 204 to suppress damage to the integrated circuit 202 or other portions of the apparatus 200 from such high-slew-rate voltage transient behavior. The RC low pass filter circuit 212 can also, or can instead, help to reject unwanted electromagnetic interference (EMI) coupled to one or both inputs of the difference amplifier circuit 204. Such EMI can induce unwanted signals when the apparatus 200 is operated in a harsh environment, such as in a transportation (e.g., automotive) or industrial environment. Other filter topologies can be used, and the techniques described herein are believed applicable to apparatus including other filters.

Generally, the supply input node VCC will not be same magnitude as the high-voltage bus voltage, POWER. For example, the integrated circuit 202 may be located elsewhere within an apparatus, system, or even facility, such as coupled to the current sensing element 210 via a cable, connector, or other electrical interconnection. As an illustrative example of an automotive application, the integrated circuit 202 can be located in a separate sub-assembly from the motor 208 and motor controller. The sub-assembly including the integrated circuit 202 may only have a low-voltage power supply available, such as to supply the input node VCC, and a ground pin, GND, such as can be connected to a local ground node, GND$_2$. This avoids routing the high-voltage power bus to the sub-assembly, such as reducing cost, complexity, and unwanted EMI or coupling between the high-voltage supply and other nodes. The power domain corresponding to the motor 208 or other load can include a ground, GND$_1$, such as coupled to or isolated from a separate ground, GND$_2$.

As an illustrative example, the power bus node voltage can have a value of 48V, and the voltage drop on the diodes across the switches S1, S2, S3, and S4 are generally about 2V (e.g., including about an 0.7V diode drop plus an IR drop due to the diode internal parasitics). A corresponding common-mode voltage at the differential pair would then toggle between about −2V and about +50V during each switching event. In order for the difference amplifier circuit 204 to remain operational, the amplifier circuit 204 can include a self-biasing scheme when the common-mode voltage at the differential input exceeds the magnitude of the VCC supply input node.

Generally, across various applications, the common-mode voltage may vary over a wide range (e.g., tens of volts or more), but the differential voltage being amplified may only be on the order of sub-milliVolts up to hundreds of milliVolts (mV). Accordingly, the present inventor has recognized that an input common-mode voltage represented exactly as (Vp+Vn)/2 can be approximated by a voltage value at either one of the differential input nodes individually, such that a voltage value at Vp (e.g., corresponding to the non-inverting input node of the amplifier circuit 204) relative to the ground voltage (e.g., GND$_2$) can be used to represent the common-mode voltage, as shown in other examples herein. Similarly, a voltage value at Vn (corresponding to the inverting input node of the amplifier circuit 204) could also be used to approximate the common-mode voltage. In this manner, a component of the differential input signal (e.g., Vp or Vn) can be used to approximate the common-mode voltage present at both Vp and Vn.

An ideal amplifier circuit would present an infinite input impedance, and therefore zero input or bias current would be drawn by the amplifier circuit at the inputs. However, practical difference amplifier circuit 204 configurations have a finite input impedance and some input current will flow into the inputs of the difference amplifier circuit 204. Generally, an imbalance in the input currents at the difference amplifier circuit 204 inputs can create a corresponding offset voltage error at the output node Vo. An offset between input currents can also be created if one of the differential inputs is used to power a difference amplifier stage, as shown and described in relation to various examples herein. The circuits and techniques shown and described herein can enhance a performance of the difference amplifier circuit 204, such as by providing balanced input currents across a wide range of input common-mode voltages. For example, the circuits and techniques described herein can provide compensation for an offset between input terminal currents when a differential input terminal is used to power a difference amplifier stage.

Figure 3:
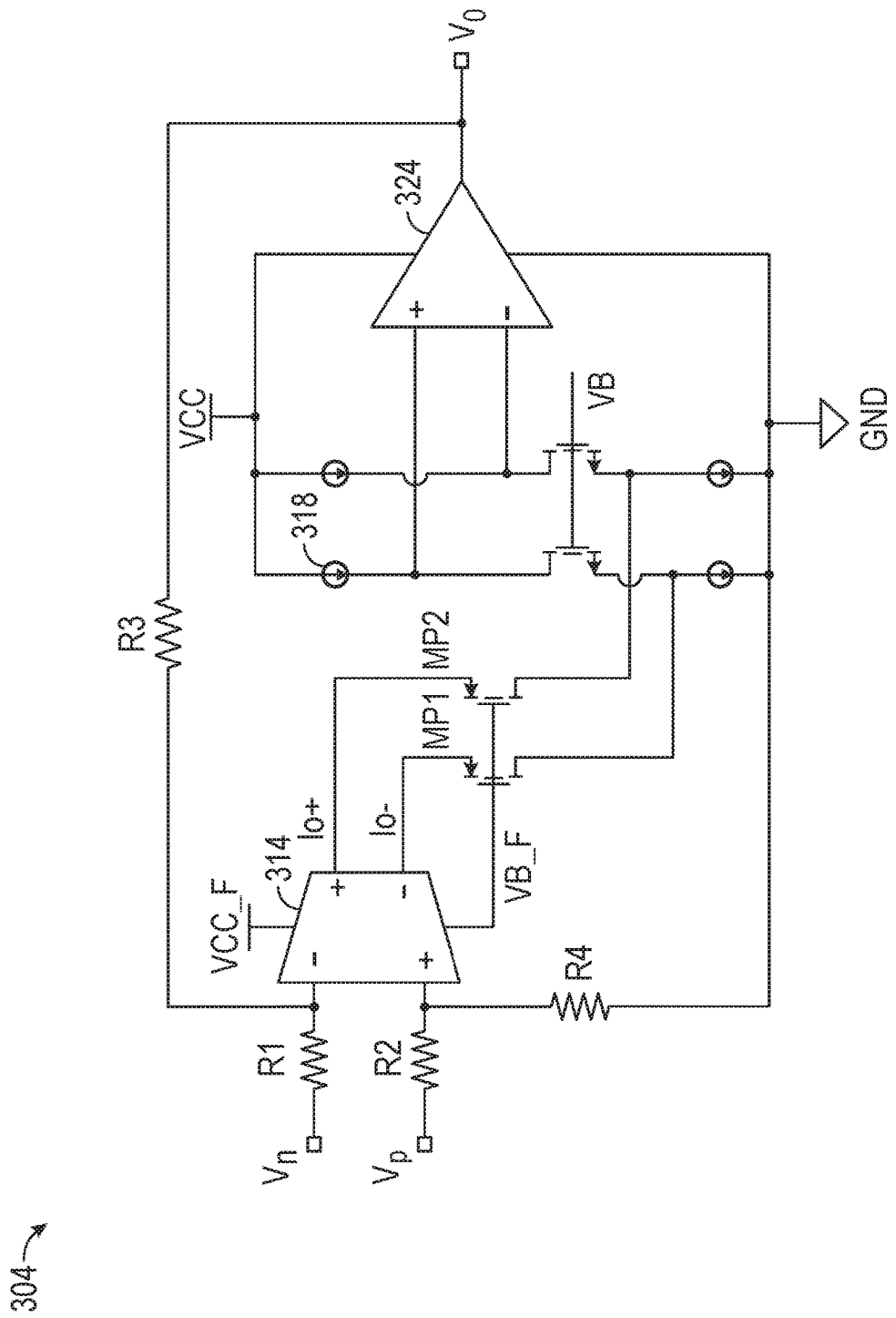
FIG. 3 illustrates generally an illustrative example of a difference amplifier circuit, such as including portions powered by a floating supply node and a supply input node.

FIG. 3 illustrates generally an illustrative example of a difference amplifier circuit 304, such as including portions powered by a floating supply node, VCC_F, and a supply input node, VCC. The difference amplifier circuit 304 can be used as a portion of the integrated circuits 102 or 202 mentioned above in relation to FIG. 1 or FIG. 2. Referring back to FIG. 3, the amplifier circuit 304 can reject a common-mode voltage at the inputs Vn, Vp, and can amplify a differential signal (representative of a difference between voltage values at nodes Vn and Vp). An input stage 314 of the amplifier circuit 304 can include an operational transconductance amplifier (OTA), and can be powered with an internally generated floating power supply at the VCC_F node. The differential input voltage signal can be converted into differential current signal (including signals Io+, Io−) by the input stage 314 (e.g., a transconductance stage) and passed to the system ground domain (e.g., GND), such as through transistors MP1 and MP2. The differential current (e.g., Io+, Io−) is then converted to voltage output signal (e.g., Vo), such as amplified through a second difference amplifier stage 324. One or more current sources such as a source 318 can be coupled to transistors as shown in FIG. 3, and such transistors can be biased using a voltage VB. In this manner, the difference amplifier stage 324 (e.g., op-amp) can function as an output amplifier to provide the output voltage, Vo, in response to currents Io+ and Io−.

Figure 4:
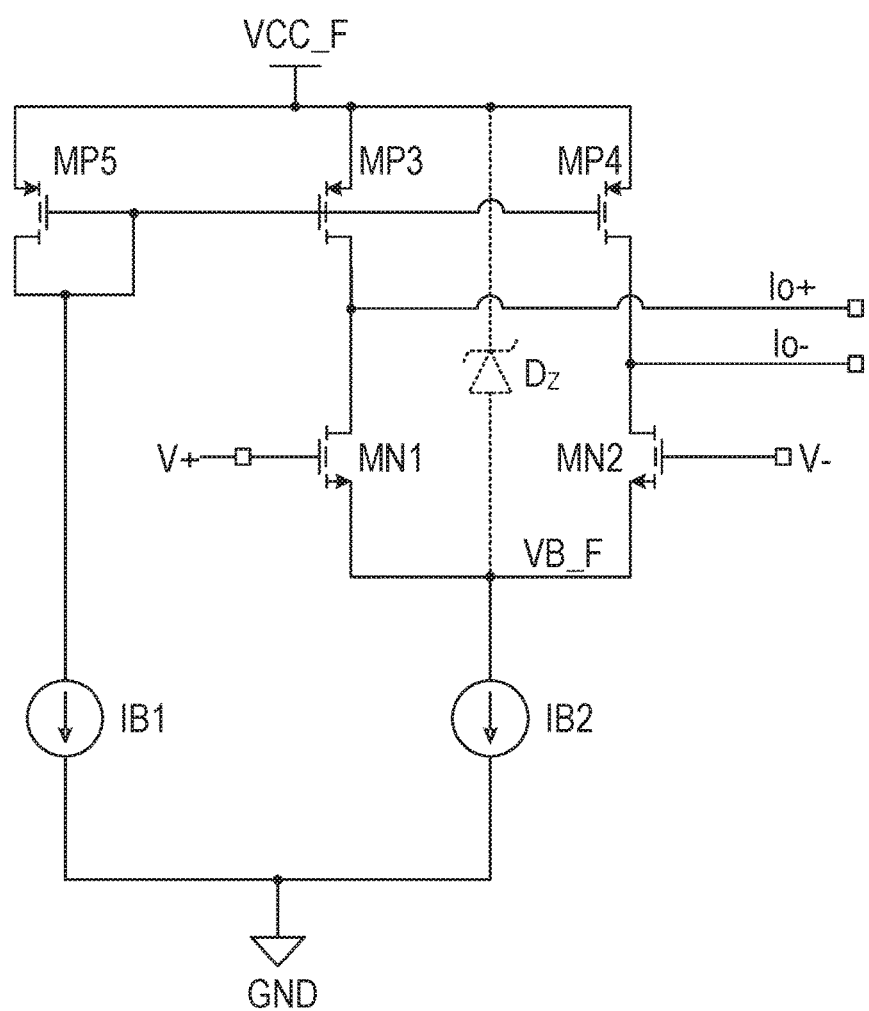
FIG. 4 illustrates generally an illustrative example of a differential transconductance amplifier circuit that can be powered using a floating supply node.

A closed-loop gain of the difference amplifier circuit 304 can be set by the resistors R1, R2, R3, and R4. As an illustrative example, if R=R2=20 kilo Ohm (kΩ), and R3=R4=1 mega Ohm (MΩ), the gain is set at 50. In the illustration of FIG. 3, MP1 and MP2 can be high-voltage transistors (e.g., having an operating voltage that exceeds VCC). For example, MP1 and MP2 can include high-voltage field-effect transistors (FETs), such as a laterally-diffused metal-oxide-semiconductor (LDMOS) devices. Elements other than MP1, and MP2, shown in the diagram of FIG. 3, can also include high-voltage devices, or, to save on one or more of area thus lower cost, higher performance, or more compact die size, such elements can be implemented using comparatively lower-voltage devices, such as powered using the VCC node. For example, as mentioned below in FIG. 4, isolated low-voltage CMOS devices can be used to provide a portion or entirety of the operational transconductance input stage 314. The conductivity types (e.g., PMOS, NMOS) of the devices shown in the example of FIG. 3 or other examples herein are merely illustrative, and complementary conductivity types can be used. The example of FIG. 3 shows FET devices, and a similar circuit configuration can be used but instead having bipolar devices, or a combination of bipolar and FET devices.

As mentioned elsewhere herein, an integrated circuit housing the difference amplifier circuit 304 of FIG. 3 can be powered using a low-voltage supply provided to the VCC node, and the input stage 314 can be selectively powered by VCC or another voltage applied at the VCC_F node. For example, as shown in FIG. 5 and described in other examples, VCC_F can be selectively coupled to VCC when an input common-mode voltage at one or more of the Vn and Vp nodes is less than a threshold, and when the common-mode voltage exceeds the threshold, VCC_F can be powered using one of Vn or Vp.

FIG. 4 illustrates generally an illustrative example of an operational transconductance amplifier circuit that can be powered using a floating supply node, such as can be used as the input stage 314 shown illustratively in FIG. 3. Referring back to FIG. 4, in current sensing applications, a differential voltage across V+ and V− is small relative to the tolerable common-mode voltage, and the voltages dropped across the transistors MN1, MN2, MP3, MP4, and MP5 are generally also small. As an illustrative example, if V+=V−=100V, then VCC_F can be driven at 100V (such as coupled to one of V+ or V−), and a voltage difference between VCC_F and VB_F can be set with a voltage regulator as approximately 5V. The voltage regulator can be as simple as a Zener diode, Dz, as shown in FIG. 4, or can be a more complex circuit topology such as to establish a voltage difference between VB_F and VCC_F suitable for the semiconductor process and voltage ratings of the devices comprising the circuit of FIG. 4. The circuit 314 of FIG. 4 can be fabricated using a bipolar/CMOS/LDMOS or "BCD-MOS" process. Such a process can provide laterally-diffused LDMOS devices, as mentioned above, such as to stand off high voltage and such a process can also be used to fabricate isolated low-voltage complementary metal-oxide-semiconductor (CMOS) devices to achieve one or more of low cost or high performance. As an illustrative example, transistors MP3, MP4, MP5, MN1 and MN2 may be low voltage CMOS transistors fabricated upon or within an isolated well within a semiconductor device. The well can be biased using a node VB_F, as shown in FIG. 3 and FIG. 4. However, use of low-voltage CMOS devices is illustrative and higher-voltage FET or bipolar devices can also be used to provide the operational transconductance input stage according to other examples.

Figure 5A:
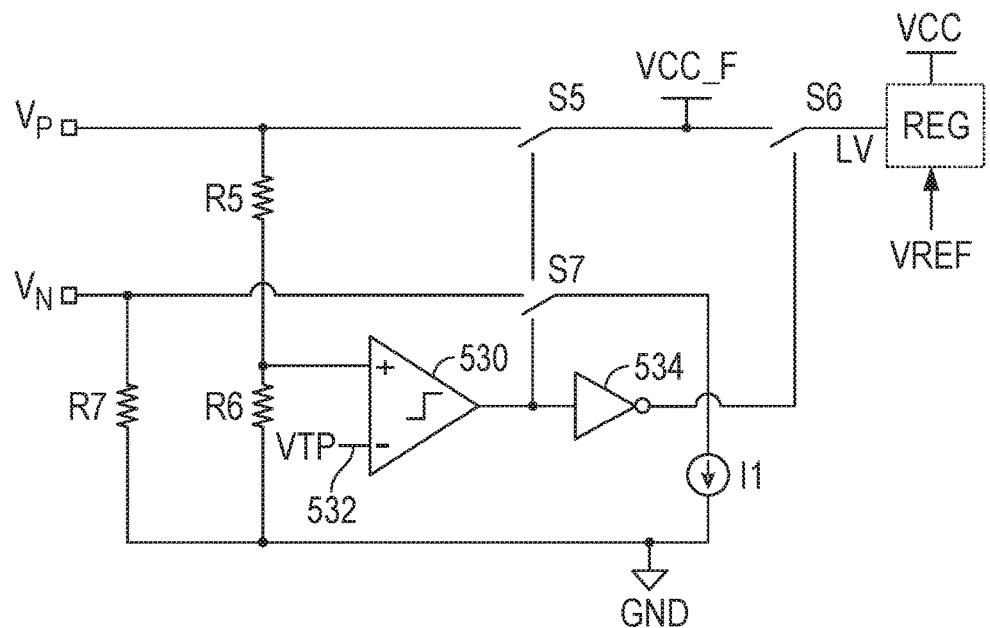
FIG. 5A illustrates generally a first illustrative example of an amplifier control circuit, such as can include a comparator, a resistor network, switches, and a current source.

As mentioned elsewhere herein, a voltage provided to the VCC_F supply node can be controlled, such as selectively coupled to a VCC node, or to a component of a differential input (e.g., one of the differential input terminals) to provide a self-biasing supply node. FIG. 5A illustrates generally a first illustrative example of an amplifier control circuit 506A, such as can include a comparator 530, a resistor circuit (e.g., including R5, R6, and R7), switches S5, S6, and S7, and a current source I1, to provide such selective control of the VCC_F node. In this illustrative example, the differential input terminals coupled Vn and Vp can be coupled to a difference amplifier circuit input stage (e.g., the circuit 214 of FIG. 2 or the circuit 314 of FIG. 3) supplied by the VCC_F node.

Referring back to FIG. 5A, when an input voltage at Vp is greater than a specified threshold (such as when the input voltage at Vp is greater than a value of the voltage at the LV node), an output of the comparator 530 can be used to close switch S5, and to open switch S6. When S5 is closed and S6 is opened, the VCC_F node is powered with the input pin Vp. The comparator 530 can also close switch S7. The current source I1 can be assigned (e.g., trimmed) to a value I1=IB1+IB2, IB1 and IB2 are shown in the illustrative example of FIG. 4. In this manner, when S7 is closed, I1 will provide a current to compensate for a discontinuity in input currents at Vp and Vn due to the additional load on Vp presented by powering the differential input stage with Vp. Such compensation with I1 decreases offset voltage error, gain error, and can reduce a sensitivity of the current sensing circuit to external series resistances, such as those associated with an RC or other filter circuit coupled to the current sensing circuit input terminals Vp and Vn.

When the input voltage at Vp is lower than the specified threshold, the comparator 530 can open switches S5 and S7, and close switch S6. In this state, the differential input stage can be powered by the LV node. The LV node can be the VCC input pin or supply rail, or the LV node can be provided by a regulator circuit REG, such as coupled to a reference voltage VREF. Unlike other approaches, such as where a resistor circuit is used to average an input voltage, there is virtually no restriction on the value of R5, R6, or R7, and to reduce power dissipation, high value resistors can be used. As an illustrative example, R5=1800 kΩ, R6=200 kΩ, R7=R5+R6=2000 kΩ. A threshold voltage, VTP, may thereby be set to 0.1 VCC. In this case, with 200 mV differential input across Vn and Vp, the input offset current due to resistors R4, R5, and R6 is only 200 mV/2MΩ=0.1 micro Amperes (μA). If the configuration shown in FIG. 5B is used, an input offset current can be virtually eliminated.

Figure 5B:
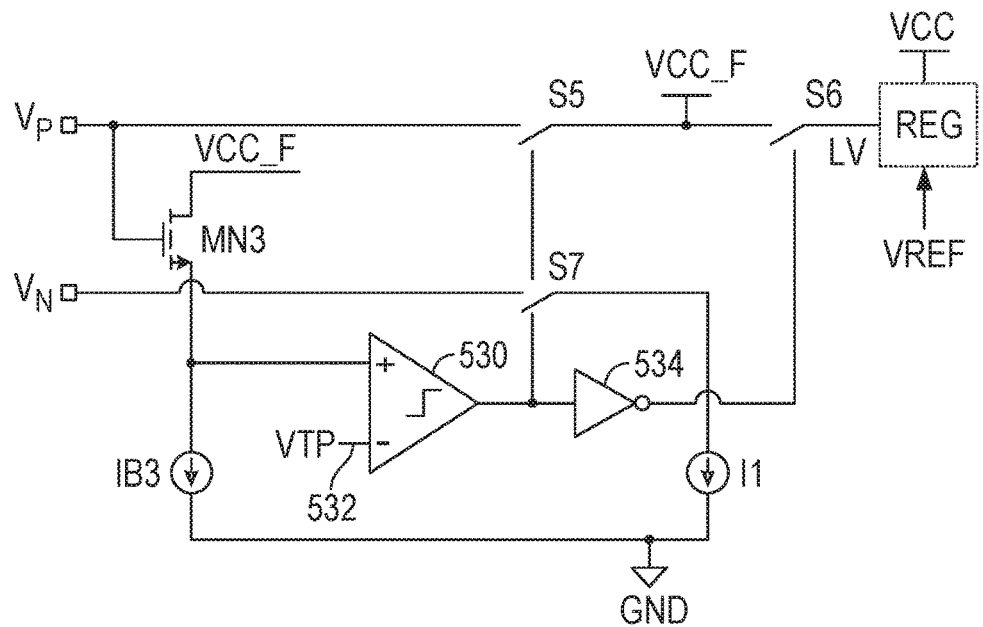
FIG. 5B illustrates generally a second illustrative example of an amplifier control circuit, such as can include a comparator, switches, and a current source.

FIG. 5B illustrates generally a second illustrative example of an amplifier control circuit 506B, such as can include a comparator 530, switches S5, S6, and S7, and a current source I1. FIG. 5B can be operated in a manner similar to FIG. 5A, where the comparator circuit 530 selectively couples either Vp or the LV node to the VCC_F node. But, in contrast to FIG. 5A, a transistor MN3 can be used as a voltage follower to sense the input voltage, Vp, instead of the resistor network shown in FIG. 5A. Referring to FIG. 5B, an input current can be kept balanced such as by assigned (e.g., trimming) I1 to have a value equal to IB1+IB2+IB3 (where IB1 and IB2 are shown in the illustrative example of FIG. 4, and IB3 is shown in FIG. 5B).

In the examples of FIG. 5A and FIG. 5B, the opposite polarity input node Vn is inhibited from powering the node VCC_F, either through the resistors R4, R5, and R6 shown in FIG. 5A, or by being entirely isolated from VCC_F in FIG. 5B. For example, in FIG. 5A, a resulting path between Vn and VCC_F is at least an order of magnitude (hundred or thousand) higher than a path between Vp and VCC_F, when switch S5 is closed. In FIG. 5A and FIG. 5B, Vp is generally used to provide a representation of a common-mode voltage because a voltage value at Vp relative to the ground node, GND, will approximate the common-mode voltage when the differential voltage (Vp−Vn) is small. But, such use of Vp is illustrative in nature, and the examples of FIG. 5A or FIB. 5B can be modified to instead use Vn to power the VCC_F node when Vn exceeds a specified threshold. In such examples, Vp would be inhibited from powering VCC_F. As mentioned above, optionally, an internal regulator circuit, REG, can be included to provide a regulated low-voltage supply at the node LV, or the node VCC can be coupled directly to the node LV.

Figure 6:
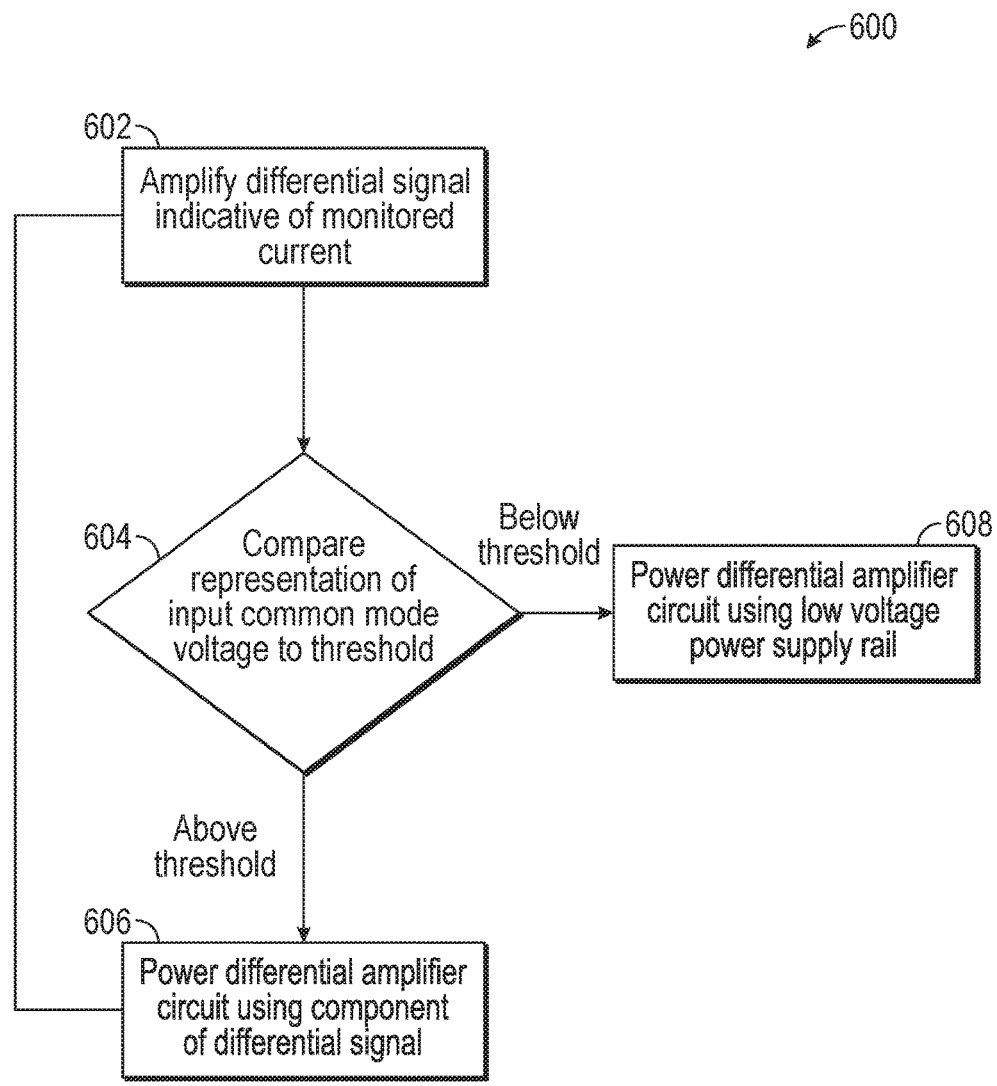
FIG. 6 illustrates generally a technique, such as a method, that can include amplifying a differential signal indicative of a monitored current, and, depending on an input common-mode voltage or a representation thereof, can power a difference amplifier circuit using either a low voltage supply rail or a floating supply node derived from a component of the differential signal being amplified.

FIG. 6 illustrates generally a technique 600, such as a method, that can include amplifying a differential signal indicative of a monitored current at 602, and, depending on an input common-mode voltage or a representation thereof, powering a difference amplifier circuit using either a low voltage supply rail or a floating supply node derived from a component of the differential signal being amplified. The technique shown in FIG. 6 can be performed using a portion or an entirety of one or more of FIG. 1, FIG. 2, FIG. 3, FIG. 4, FIG. 5A, or FIG. 5B. At 602, a differential signal can be amplified, such as using an amplifier circuit topology as shown illustratively in FIG. 3. A differential input stage of the amplifier circuit topology can be implemented such as corresponding to the circuit of FIG. 4. The differential signal can be monitored across a sensing element such as a resistor, as shown illustratively in FIG. 1 and FIG. 2. At 604, a comparison can be made between a signal representative of a common-mode voltage present at the difference amplifier input and a threshold. For example, such a representation can include using a component (e.g., one terminal or node) of the differential input signal, particularly where the differential signal is small in magnitude relative to a common-mode voltage.

The threshold can be established such that, for example, when the representation of the common mode voltage exceeds a supply voltage (e.g., VCC), then at 606, the difference amplifier circuit can be powered using a component of the differential signal (e.g., a specified one of either Vp, a positive input, or Vn, a negative input). At 608, if the representation of the common mode voltage is below the specified threshold, the difference amplifier can be powered using a low-voltage power supply rail (e.g., a value provided at node VCC as an input to an integrated circuit package housing the differential amplifier). An illustrative example of the behavior described in FIG. 6 and elsewhere herein is shown in FIG. 7.

Figure 7:
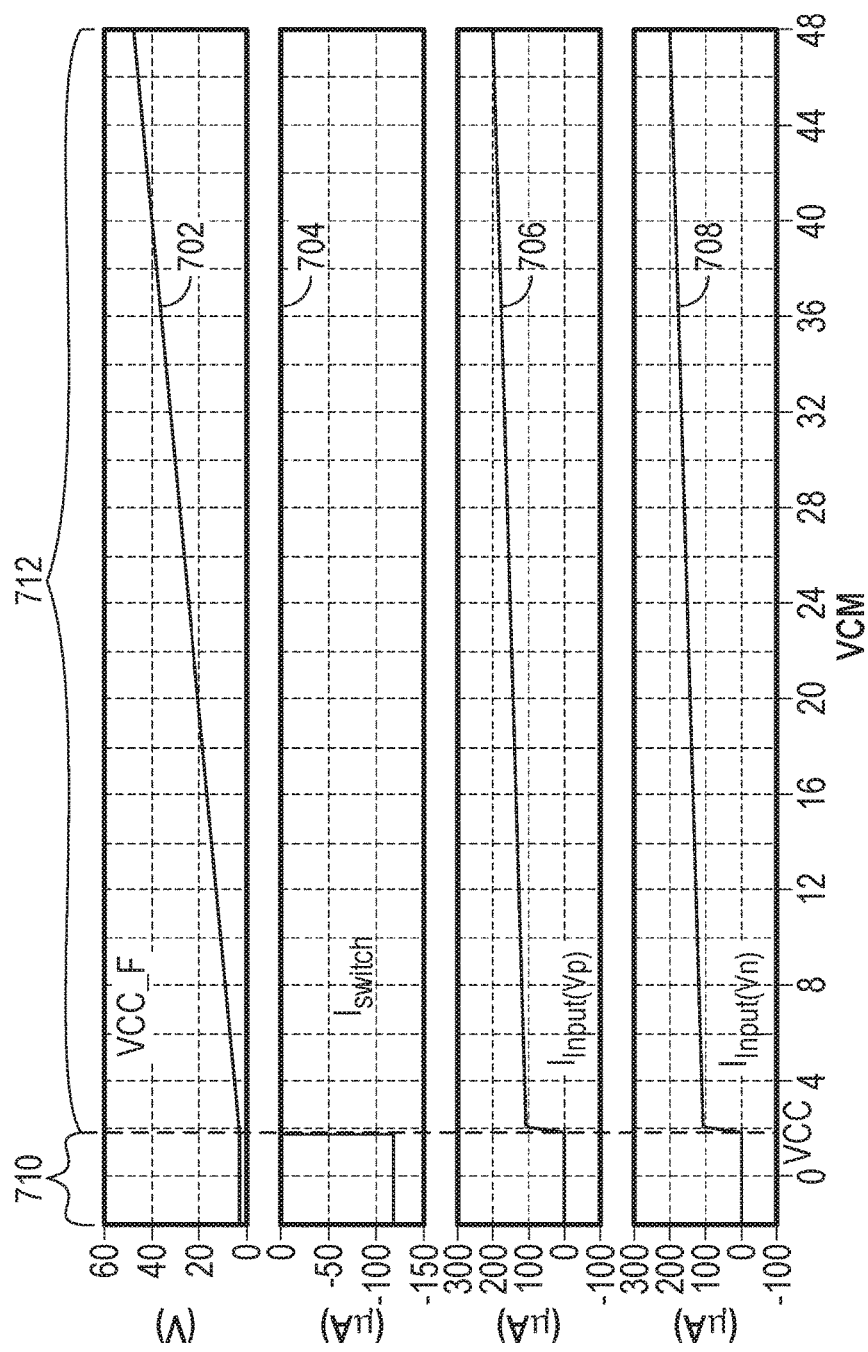
FIG. 7 illustrates generally an illustrative example comprising a simulation of an electrical apparatus comprising a difference amplifier circuit as described elsewhere herein, where a floating supply node is assigned a first voltage value during a first mode of operation, and wherein the floating supply node is driven using a component of a differential signal being amplified in a second mode of operation, such as to extend an operating capability of the difference amplifier circuit when the common-mode input voltage exceeds a power supply voltage, such as an input power supply voltage.

FIG. 7 illustrates generally an illustrative example comprising a simulation of an electrical apparatus comprising a difference amplifier as described elsewhere herein, where a floating supply node (e.g., VCC_F) voltage 702 is assigned a first voltage value during a first mode of operation at 710, and wherein the floating supply node is driven using a component of a differential signal being amplified in a second mode of operation 712, such as to extend an operating capability of the difference amplifier when the common-mode input voltage (VCM) exceeds an input supply node VCC value. When VCM exceeds an input VCC value (such as just under 2V in the illustration of FIG. 7), the VCC_F node can be forced to track (e.g., follow) an input node voltage at one of the differential inputs. A current flowing 704 through a switch (e.g., switch S7 as shown in FIG. 5A and FIG. 5B) between VCC and VCC_F shows VCC_F sinking about 100 μA from VCC when VCM is below the VCC value. When VCM is set equal to a value corresponding to the VCC node, then input Vp can be used to power the difference amplifier circuit, and the current flowing through the switch is zeroed. The additional current from Vp causes a discontinuity in the Input (Vp) 706, and a current source (e.g., I1 as shown in FIG. 5A and FIG. 5B) can be used to drive a corresponding current 708 at the Vn node to balance the currents. In this manner, an input current balance is maintained across a broad range of VCM values, including VCM values below and above a low-voltage supply rail value at VCC.

VARIOUS NOTES

Each of the non-limiting aspects above can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electrical apparatus for generating a signal indicative of a monitored voltage difference, the apparatus comprising:
an integrated circuit comprising:
a difference amplifier circuit comprising:
a two-terminal input to receive a differential signal, and
an output to provide the signal indicative of the input differential signal; and
an amplifier control circuit, electrically coupled to the difference amplifier circuit, to compare a signal representative of a common-mode input voltage at the input of the difference amplifier circuit to a specified threshold, and, in response, when the signal representative of the common-mode input voltage exceeds the specified threshold, to electrically couple a first terminal of the two-terminal input to the difference amplifier circuit to power the difference amplifier circuit;
wherein the amplifier control circuit comprises a current source; and
wherein the current source is capable of being electrically coupled to a second terminal of the two-terminal input to compensate for an offset between respective input currents through the first and second terminals, wherein the second terminal comprises a polarity opposite the first terminal.

2. The electrical apparatus of claim 1, wherein a second terminal of the two-terminal input is inhibited from powering the difference amplifier circuit.

3. The electrical apparatus of claim 2, wherein a resistance provided between the first terminal and a second terminal is at least an order of magnitude greater in value than a resistance through an electrical path between the first terminal and an internal supply node powering the difference amplifier circuit, when the first terminal is electrically coupled to power the difference amplifier circuit.

4. The electrical apparatus of claim 1, further comprising a sensing resistor; and
wherein the monitored voltage difference comprises a voltage representative of a current flowing through the sensing resistor.

5. The electrical apparatus of claim 1, wherein the amplifier control circuit comprises switches controlled by a comparator circuit, the switches configured to respectively electrically couple the first terminal to an internal supply node powering the difference amplifier circuit and to couple the second terminal to the current source.

6. The electrical apparatus of claim 1, wherein the amplifier control circuit comprises a comparator circuit including a first input coupled to a node providing a voltage representative of the first terminal and a second input coupled to a threshold voltage corresponding to the specified threshold.

7. The electrical apparatus of claim 6, wherein the second terminal of the difference amplifier circuit is coupled to the first input of the comparator circuit through a resistor circuit, the resistor circuit configured to provide the signal representative of the common-mode input voltage.

8. The electrical apparatus of claim 1, wherein the amplifier control circuit is configured to inhibit the first terminal from powering the difference amplifier circuit when the signal representative of the common-mode input voltage is less than the specified threshold, and configured to electrically couple a supply input node to the difference amplifier circuit to power the difference amplifier circuit using a voltage corresponding to a supply input voltage when the signal representative of the common-mode input voltage is less than the specified threshold.

9. The electrical apparatus of claim 1, comprising a current sensing element.

10. The electrical apparatus of claim 9, further comprising a filter circuit coupled between the current sensing element and the two-terminal input, the current sensing element and the filter circuit separate from the integrated circuit.

11. The electrical apparatus of claim 1, wherein the difference amplifier circuit comprises a transconductance topology configured to provide a differential current output corresponding to the differential signal received at the input of the difference amplifier circuit.

12. The electrical apparatus of claim 11, comprising a second amplifier circuit including an input configured to receive a differential current from the output of the difference amplifier circuit, and including an output to provide the signal indicative of a monitored current in response to the received differential current.

13. The electrical apparatus of claim 12, wherein the second amplifier circuit is configured to be powered using a supply input node using a voltage corresponding to a supply input voltage that is lesser in magnitude than a common-mode input voltage capability.

14. An electrical apparatus for generating a signal indicative of a monitored current, the apparatus comprising:
a current sensing element located in series with an electrical load;
an integrated circuit comprising:
a difference amplifier circuit comprising:
an input compatible with a common-mode input voltage exceeding a supply input voltage of the integrated circuit; and
an output to provide the signal indicative of the monitored current; and
an amplifier control circuit, electrically coupled to the difference amplifier circuit, including a comparator to compare a signal representative of a common-mode input voltage at the input of the difference amplifier circuit to a specified threshold, and, in response, when the signal representative of the common-mode input voltage exceeds the specified threshold, to power the difference amplifier circuit using an input terminal of the difference amplifier circuit, the difference amplifier circuit separate from the comparator included as a portion of the amplifier control circuit;
wherein the amplifier control circuit is configured to compensate for an offset between respective input currents through respective first and second input terminals of the difference amplifier circuit when the difference amplifier circuit is powered using an input terminal amongst the respective first and second input terminals.

15. The electrical apparatus of claim 14, wherein the amplifier control circuit is configured to inhibit the input terminal from powering the difference amplifier circuit when the signal representative of the common-mode input voltage is less than a specified threshold, and configured to electrically couple a supply input node to the difference amplifier circuit to power the difference amplifier circuit using a voltage corresponding to the supply input voltage that is lesser in magnitude than the common-mode input voltage capability when the signal representative of the common-mode input voltage is less than the specified threshold.

16. A method for generating a signal indicative of a monitored current through a current sensing element, the method comprising:

amplifying a differential signal indicative of the monitored current using a difference amplifier circuit; and when an input common mode voltage of the difference amplifier circuit exceeds a specified threshold voltage, changing powering of the difference amplifier circuit from using a power supply rail to using a component of the differential signal to power the difference amplifier circuit, including compensating for an offset between respective input currents through respective first and second input terminals of the difference amplifier circuit when the difference amplifier circuit is powered using the component of the differential signal.

17. The method of claim 16, comprising comparing a signal representative of a common-mode input voltage at the input of the difference amplifier circuit to a specified threshold; and in response, when the signal representative of the common-mode input voltage exceeds the specified threshold voltage, electrically coupling one polarity of the differential signal to power the difference amplifier circuit to provide a common-mode input voltage capability greater in magnitude than a supply input voltage specification of an integrated circuit comprising the difference amplifier circuit.

18. The method of claim 16, comprising electrically coupling a current source to an input of the difference amplifier circuit to compensate for an offset between respective input currents at input terminals of the difference amplifier circuit.

19. The method of claim 18, comprising establishing a fixed current using the current source, the fixed current representative of an input current at an input terminal of the difference amplifier circuit when the difference amplifier is being powered by the component of the differential signal.

20. The method of claim 19, wherein the current source is trimmed to establish the fixed current.

* * * * *